United States Patent [19]

Carson et al.

[11] 4,336,616

[45] Jun. 22, 1982

[54] DISCRIMINATOR AIDED PHASE LOCK ACQUISITION FOR SUPPRESSED CARRIER SIGNALS

[76] Inventors: Robert A. Frosch, Administrator of the National Aeronautics and Space Administration, with respect to an invention of Lansing M. Carson; F. Elvin Krasin, both of Scottsdale, Ariz.

[21] Appl. No.: 969,762

[22] Filed: Dec. 15, 1978

[51] Int. Cl.³ .............................................. H04B 1/68
[52] U.S. Cl. .................................. 455/202; 455/208; 455/234; 455/306; 328/166
[58] Field of Search ............. 325/49, 50, 65, 329–331, 325/404, 408, 411, 417, 414, 402, 473–476, 419, 421, 346, 240, 250, 251, 256, 258, 259, 264; 328/166; 331/17, 1, 4; 455/202, 208, 46, 63

[56] References Cited

U.S. PATENT DOCUMENTS

| | | | |
|---|---|---|---|
| 3,701,948 | 10/1972 | McAuliffe | 325/329 |
| 3,849,730 | 11/1974 | Ho | 325/329 |
| 3,984,778 | 10/1976 | Bhopale | 325/329 |
| 4,048,566 | 9/1977 | Carson | 325/329 |

OTHER PUBLICATIONS

The False Lock Performance of Costas Loops with Hard-Limited In-Phase Channel, IEEE Transactions on Communications, Bol. Com-26, No. 1, 1/78, by Marvin K. Simon.

Improving Frequency Acquisition of a Costas Loop, IEEE Transactions on Communication, vol. COM-25, No. 12, Dec. 1977, pp. 1453-1459.

*Primary Examiner*—Tommy P. Chin
*Attorney, Agent, or Firm*—Paul F. McCaul; John R. Manning

[57] ABSTRACT

A discriminator aided technique for acquisition of phase lock to a suppressed carrier signal utilizes a Costas loop which is initially operated open loop and control voltage for its VCXO is derived from a phase detector that compares the VCXO to a reference frequency thus establishing coarse frequency resolution with the received signal. Then the Costas loop is closed with the low-pass filter of the channel having a bandwidth much greater (by a factor of about 10) than in the I channel so that a frequency discriminator effect results to aid carrier resolution. Finally, after carrier acquisition, the Q-channel filter of the Costas loop is switched to a bandwidth substantially equal to that of the I-channel for carrier tracking.

5 Claims, 2 Drawing Figures

DISCRIMINATOR AIDED PHASE LOCK ACQUISITION FOR SUPPRESSED CARRIER SIGNALS

ORIGIN OF THE INVENTION

The invention described herein was made in the performance of work under a NASA contract and is subject to the provisions of Section 305 of the National Aeronautics and Space Act of 1958, Public Law 85-568 (72 Stat. 435, 42 USC 2457).

BACKGROUND OF THE INVENTION

This invention relates to Costas loops, and more particularly to a modification of the Costas loop in suppressed-carrier receivers employed for carrier acquisition and tracking.

Frequency uncertainties in a receiver signal or in the local oscillator (LO) of a receiver attempting to acquire phase lock to the signal require special techniques to bring the receiver frequency close enough to the received frequency to acquire lock. One method that has been used is frequency sweep, either of the transmitter generating the received signal or of the receiver LO. This adds to the acquisition time since sweep rates are limited by the receiver phase lock loop bandwidths. It requires tracking of the swept frequency if the received signal is swept. (Until lock is detected and the command is sent back to the transmitter to disable the sweep.) If the receiver LO is swept, receiver complexity is increased and the sweep function further contributes to the frequency uncertainty. Finally, detectors for suppressed carrier signals can false lock on data sidebands without the right combination of sweep rate, detector filter bandwidths and data rate. This correct combination might be precluded by other considerations.

An object of this invention is to speed acquisition of phase lock to a suppressed carrier signal without the complexity and potential problems associated with alternate methods, such as frequency sweep, and to provide for tracking with a narrow bandwidth to minimize cycle skipping and to improve range rate accuracy.

SUMMARY OF THE INVENTION

In accordance with the present invention a carrier acquisition and tracking Costas loop is provided with first switching means to open the Costas loop during search for initial acquisition and closing an auxiliary loop that uses an external voltage controlled reference oscillator and a phase detector for locking the Costas loop voltage controlled oscillator to the reference, thus establishing coarse frequency resolution with the received carrier. The first switching means is then opened and a second switching means is closed to close the Costas loop with a loop filter selected to give the Costas loop a relatively wide acquisition bandwidth. At the same time, the quadrature (Q) filter is controlled to have a wider bandwidth (by a factor of at least approximately 10) than the in-phase (I) filter of the Costas loop, where the latter includes at the output stage thereof a hard limiter. The I-Q multiplier action is thus modified during this acquisition mode to provide discriminator aided acquisition of the carrier frequency. Once acquisition is completed, the second switch means closed for the acquisition means is opened and a third switch means is closed to establish a narrow loop filter bandwidth for tracking. At the same time the bandpass of the Q filter is narrowed to approximately the bandpass of the low-pass filter in the I channel to fully restore the Costas loop for carrier tracking.

The novel features of the invention are set forth with particularity in the appended claims. The invention will best be understood from the following description when read in conjunction with the accompanying drawings.

DESCRIPTION OF PREFERRED EMBODIMENT

Figure 1:
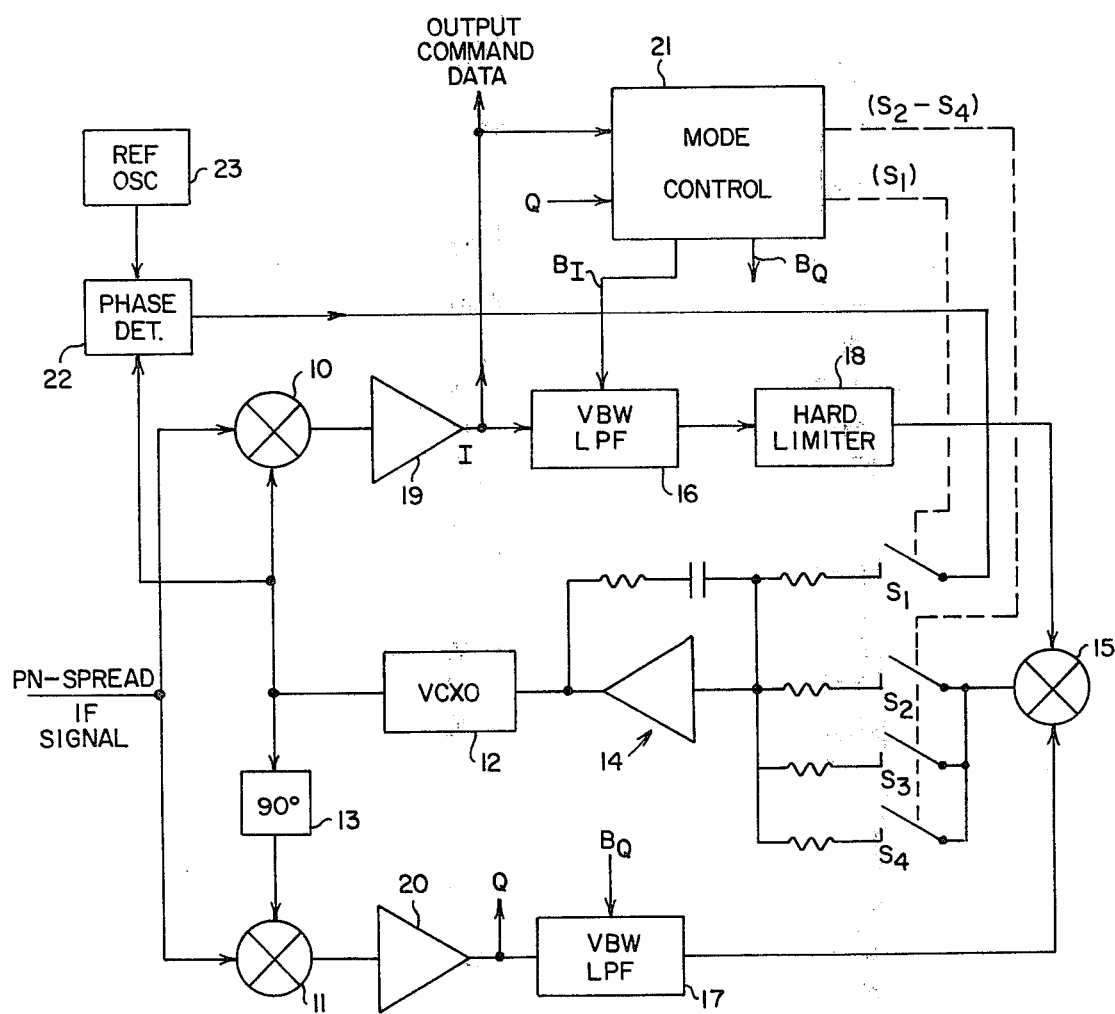
FIG. 1 is a functional block diagram illustrating schematically the organization of a preferred embodiment of a Costas loop for acquisition and tracking a suppressed carrier.
Figure 2:
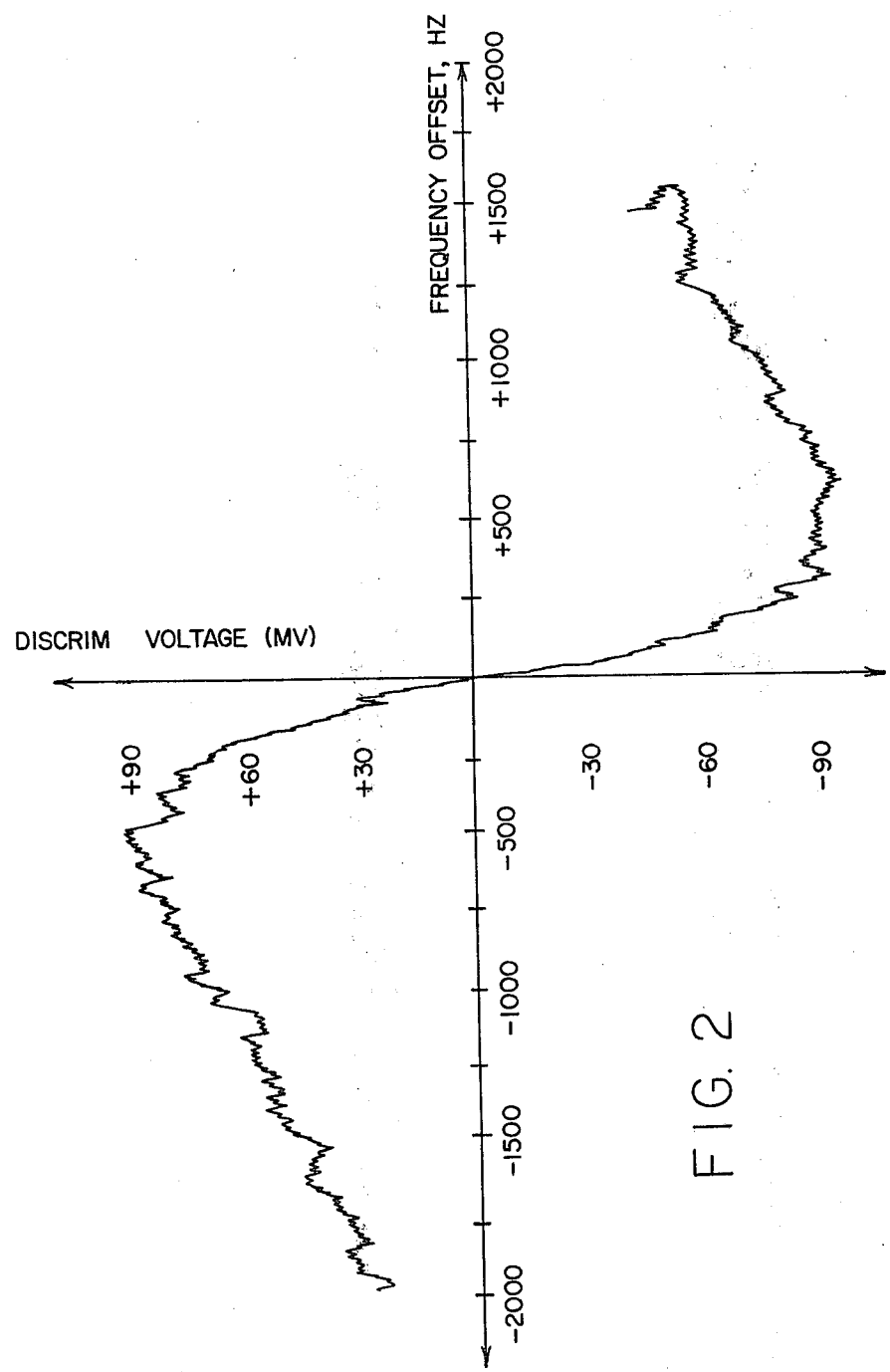
FIG. 2 is an actual plot of the discriminator characteristic of a Costas detector with an I leg single-pole filter bandwidth (3 dB) of 510 Hz and a Q leg single-pole filter bandwidth (3 dB) of 5 KHz.

Referring to FIG. 1 of the drawings, the basic I-Q detector and multiplier portion of a suppressed carrier Costas detector is comprised of two phase detectors (multipliers) 10 and 11, a voltage controlled crystal oscillator (VCXO) 12, a 90° phase shifter 13, a loop filter 14, a multiplier 15, two variable bandwidth filters 16 and 17 and a hard limiter 18. Included in the loop are isolation amplifiers 19 and 20 from which in-phase (I) and quadrature (Q) signals are transmitted to a mode control unit 21. For a theoretical discussion of this basic Costas loop, and of the modification to be described below, see Marvin K. Simon, "The False Lock Performance of Costas Loops with Hard-Limited In-Phase Channel," IEEE Transactions on Communications, Vol. COM-26, No. 1, pp 23-34 January 1978. Briefly, the error signal to the VCXO is formed by the multiplier 15 from the product of the in-phase and quadrature signals, I and Q. In a more basic Costas loop, both I and Q are analog signals, but as noted by Dr. Simon in his paper, supra, "For hardware implementation reasons associated with the reduction of dc offsets, it is often desireable to hard limit the output of the in-phase channel thus allowing one to replace the above analog (four-quadrant) multiplier with a simpler chopper-type device which typically exhibits much less offset." The multiplier 15 is thus of that chopper type. The hard limiter 18 shown as a separate functional block is preferably implemented as part of the output stage of the in-phase channel filter, particularly when, as in this preferred embodiment, the channel filters are implemented as variable bandwidth low-pass filters in order to modify the characteristics of the Costas loop in different modes, namely PN search and acquisition, carrier acquisition, and carrier tracking modes.

The Costas loop filter 14 is a second order, Type II configuration with switchable source inputs and time constants for the three distinct modes of operation listed above. In the first mode for PN search and acquisition, a switch $S_1$ is closed to permit an acquisition voltage to be introduced through the loop filter 14 while switches $S_2$–$S_4$ are open to operate the Costas loop in an open loop manner. This allows a VCXO/REF phase detector (discriminator) 22 to lock the VCXO to a reference frequency from a reference oscillator 23 and thus establish coarse frequency resolution with an IF signal of the received carrier.

After PN lock has been established in the first mode, the switch $S_1$ is opened and switch $S_2$ or $S_3$ (depending on acquisition bandwidth applicable to the data rate) is closed. The corresponding resistor connected to the closed switch is chosen to give the closed Costas loop a relatively wide acquisition bandwidth. The wider acquisition bandwidth is desirable in that it allows self-acquisition for a greater frequency and a more rapid carrier lock-up. At the same time, the Q-channel filter 17 is set, by switching controls from the mode control unit 21, for a bandpass wider than the I-channel filter 16 so that a frequency discriminator effect results. This discriminator effect aids the carrier acquisition.

To understand the discriminator effect referred to, consider that the Q-channel filter 17 is completely bypassed by a switch, thus effectively widening the Q-channel filter to the maximum extent possible. The IQ multiplier 15 receives the hard limited I signal and switches the polarity of the Q signal in accordance with the levels of the I signal. Thus, under strong signal conditions, action of the I channel is to demodulate data which in turn removes the data from the Q signal so that the resulting Q signal is always in the proper polarity to produce an error signal. With weak signals (low signal to noise ratio), operation is basically determined by the signal to noise ratio in the I channel so that the noise performance is not greatly influenced by the bandwidth of the Q filter. More particularly, the discriminator action resulting from widening the Q filter 17 can be visualized as follows: It may be noted that the output from the I phase detector 10 is 90° out of phase with the output of the Q phase detector. If we shift the signal from the I detector by 90° and multiply by the Q signal, the output for the signal component is a dc voltage plus a double frequency sine wave. Since the noise components in each I and Q signal are uncorrelated, the product of the noise does not yield any dc voltages. Thus when a signal appears at the input, a dc voltage is produced that has the proper polarity to pull the VCXO towards the correct lock point.

The single pole low pass filter 16 in the I channel shifts the phase of the I signal by 90° in the cut off region of the filter. The limiter produces a square wave reversing signal to the IQ multiplier 15 which effectively rectifies the signal out of the Q channel. This dc voltage pulls the VCXO towards lock. Close to the lock point, the phase shift of the filter goes to zero and the resulting dc voltage of the discriminator goes to zero. In practice, the Q channel has a filter about 10 times the bandwidth of the I channel so that its phase shift over the pull-in range is negligible. Typically, the bandwidth of the I channel single-pole filter may be as 510 Hz (3 dB). Advantages of this discriminator aiding feature are as follows: the effective pull-in rate of the loop can be made higher than a sweep rate could be made due to zero loop stress at the lock point; the loop acquisition bandwidth can be widened to improve acquisition characteristics because: (a) There is zero stress at the lock point; and (b) The discriminator voltage holds the frequency to the correct value when cycle slipping or loss of lock occurs due to noise; and the combination of the channel filter bandwidths, loop acquisition bandwidth and discriminator action lifts the detector output voltage responses to spurs away from the zero-voltage (lock point) axis and thereby reduces the tendency to false lock to data spurs.

After carrier lock-up, the two filters 16 and 17 are switched to have the same bandwidth by the mode control unit 21. In the implementation of the filters, they may be provided with subcircuits that are electronically switched in and out to change bandwidth as needed. Alternatively, separate filters of different selected bandwidths may be provided with means for electronically switching (substituting) one filter for another. In either case, the mode control unit accomplishes the switching of bandwidth in going from the second mode to the third mode once carrier lock-up has been established.

In the third mode, the switch closed in the second mode is opened, and switch $S_3$ or $S_4$ (depending on tracking bandwidth applicable to the data rate) is closed. This establishes a narrow carrier tracking bandwidth to minimize cycle skipping and to improve range rate accuracy.

Both the I and the Q signal is applied to the mode control unit 21 which may include circuits for determining when to shift from one mode to the other and generate the appropriate mode control signals for the switches $S_1$–$S_4$ and the bandwidth selection signals $B_I$ and $B_Q$ for the low pass filters. In the most basic application of the invention, only the bandwidth of the Q filter would be switched, so only the control signal $B_Q$ would be required. For lock detection, both the I and Q signals may be applied to absolute value detectors (similar in function to full-wave rectifiers). The determination of carrier lock is made by subtracting the Q channel power estimate, $|Q|$, from the I channel power estimate, $|I|$. This subtraction will produce a zero output when the loop is unlocked, since identical quadrature beat notes or uncorrelated noise will produce identical DC voltages. Conversely, when the loop is locked, the data modulation appears in the I channel and only a residual signal, which is proportional to the noise power and carrier phase error, remains in the quadrature channel. A threshold detector decides whether $|I|$ is sufficiently greater than $|Q|$ (where averaged over an appropriate time period) to produce the carrier lock indication. Noncoherent Carrier AGC may derive from the $|I|$ signal. Output command data is derived from the low-pass filtered I channel and routed to a command detector unit (not shown) for further processing.

Although particular embodiments of the invention have been described and illustrated herein, it is recognized that modifications and variations may readily occur to those skilled in the art and consequently, it is intended that the claims be interpreted to cover such modifications and equivalents.

What is claimed is:

1. An improved method for phase lock acquisition of a suppressed carrier signal using a Costas loop having a voltage controlled oscillator, an in-phase channel, a quadrature-phase channel, two low-pass filters, and a hard limiter in the in-phase channel following a first one of said low-pass filters, and having a second one of said low-pass filters in the quadrature-phase channel with variable bandwidth comprising the steps of switching the low-pass filter in the quadrature-phase channel to a bandwidth wider than the bandwidth of the low-pass filter of the in-phase channel by a large factor of at least about ten so that a frequency discriminator effect results from multiplying the hard-limited, narrower bandwidth in-phase channel signal with the wide bandwidth quadrature-phase channel signal to speed acquisition of phase lock, and after carrier acquisition is thus achieved, switching the low-pass filter in the quadrature-phase channel to a bandwidth of the in-phase channel for carrier tracking.

2. An improved method as defined in claim 1 wherein the first step for carrier acquisition is preceded by an initial step of switching the Costas loop open and driving the voltage controlled oscillator of the loop to a predetermined reference frequency, thereby to establish coarse frequency resolution with the suppressed carrier signal before applying the discriminator aided technique for carrier acquisition in the first step.

3. In a Costas loop for acquisition and tracking a suppressed carrier signal, said loop having an in-phase and a quadrature-phase channel, said in-phase channel having a phase detector for comparing the phase of said carrier signal and a signal from a voltage controlled oscillator and having a low-pass filter and hard limiter in series between the output of said in-phase phase detector and the input of a multiplier for the output signals of the in-phase and quadrature-phase channels, said quadrature-phase channel having means for shifting the output of said voltage controlled oscillator by 90° and a phase detector for comparing the phase of said carrier signal and a signal from said voltage controlled oscillator shifted 90°, and having a variable low-pass filter in series between the output of said quadrature phase detector and the input of said multiplier, said loop further having a variable loop filter in series between the output of said multiplier and said voltage controlled oscillator, the improvement comprised of means for varying said quadrature-phase channel low-pass filter to a bandwidth greater than the bandwidth of the in-phase channel low-pass filter by a factor of at least ten, thereby producing a frequency discriminator effect at the output of said multiplier to aid carrier acquisition, and for varying the bandwidth of the quadrature-phase channel filter to a bandwidth substantially equal to the bandwidth of the in-phase channel low-pass filter for carrier tracking, and means for controlling said variable loop filter to have a wide bandwidth for carrier acquisition while said means for varying said quadrature channel filter is set for carrier acquisition and to have a narrower bandwidth for carrier tracking while said means for varying said quadrature channel filter is set for carrier tracking.

4. In a Costas loop as defined in claim 3, the combination further including a source of a reference frequency signal and a reference phase detector connected to detect the frequency of said voltage controlled oscillator with said reference frequency signal, and to produce a signal proportional to any difference, the improvement further including means for switching said loop open by disconnecting said multiplier from said loop filter, and connecting thereto the output of said reference phase detector, thereby to drive said voltage controlled oscillator to a frequency determined by said reference frequency signal for coarse frequency resolution with the suppressed carrier signal, said switching means being operable to reconnect said multiplier to said loop filter and disconnect said reference phase detector from said loop filter for operation in a carrier acquisition mode followed by a carrier tracking mode.

5. A Costas loop having improved characteristics for phase lock of a voltage controlled oscillator to a suppressed carrier signal, said loop having an in-phase channel comprised of a low-pass filter and hard limiter in series between a multiplier and a phase detector connected to receive said suppressed carrier and the output of said oscillator, and having a quadrature-phase channel comprised of means for shifting the output of said voltage controlled oscillator by 90°, a low-pass filter in series between said multiplier and a phase detector connected to receive said suppressed carrier and the output of said oscillator shifted 90° relative to the output of said oscillator connected to said in-phase detector, said loop further having a filter connecting the output of said multiplier to said voltage controlled oscillator, the improvement consisting of a filter with a controlled bandwidth for said quadrature-phase channel, and means for controlling the bandwidth of said quadrature-phase channel filter to be wider by a factor of at least about 10 than the bandwidth of said in-phase channel filter for carrier acquisition and to be equal to the bandwidth of said in-phase channel filter for carrier tracking.

* * * * *